(12) United States Patent
Hadler-Jacobsen

(10) Patent No.: US 9,945,909 B2
(45) Date of Patent: Apr. 17, 2018

(54) MONITORING MULTIPLE SUBSEA ELECTRIC MOTORS

(71) Applicant: ONESUBSEA IP UK LIMITED, London (GB)

(72) Inventor: Aage Hadler-Jacobsen, Nesttun (NO)

(73) Assignee: ONESUBSEA IP UK LIMITED, London (GB)

( * ) Notice: Subject to any disclaimer, the term of this patent is extended or adjusted under 35 U.S.C. 154(b) by 352 days.

(21) Appl. No.: 14/631,641

(22) Filed: Feb. 25, 2015

(65) Prior Publication Data
US 2016/0245868 A1    Aug. 25, 2016

(51) Int. Cl.
| G01R 31/34 | (2006.01) |
| G01R 31/02 | (2006.01) |
| H02P 29/02 | (2016.01) |
| H02J 3/26 | (2006.01) |
| H02J 13/00 | (2006.01) |

(52) U.S. Cl.
CPC ......... *G01R 31/343* (2013.01); *G01R 31/025* (2013.01); *H02J 3/26* (2013.01); *H02J 13/00* (2013.01); *H02P 29/02* (2013.01); *Y02E 40/50* (2013.01)

(58) Field of Classification Search
CPC ....... G01R 31/343; G01R 31/025; H02J 3/26; H02J 13/00; H02P 29/02; Y02E 40/50
USPC ........................................................ 324/509
See application file for complete search history.

(56) References Cited

U.S. PATENT DOCUMENTS

| 1,923,727 A | 8/1933 | Hodnette |
| 2,949,849 A | 8/1960 | Gundlach |
| 3,666,992 A | 5/1972 | Goodman |
| 3,760,314 A | 9/1973 | Krasienko et al. |
| 4,138,699 A | 2/1979 | Ura et al. |
| 4,789,363 A | 12/1988 | Wicklein |
| 4,975,797 A | 12/1990 | Veverka et al. |
| 5,131,464 A | 7/1992 | Lenhart et al. |
| 5,179,489 A | 1/1993 | Oliver |
| 5,272,442 A | 12/1993 | Schemmel et al. |
| 5,324,886 A | 6/1994 | Nakatake et al. |

(Continued)

FOREIGN PATENT DOCUMENTS

| CA | 2097120 A1 | 12/1993 |
| EP | 2570585 A1 | 3/2013 |

(Continued)

OTHER PUBLICATIONS

International Search Report for International application No. PCT/EP2016/052418 dated Apr. 28, 2016.

(Continued)

*Primary Examiner* — Billy Lactaoen
(74) *Attorney, Agent, or Firm* — Fletcher Yoder, P.C.

(57) ABSTRACT

According to some embodiments, two or more subsea motors are run simultaneously from a common topside frequency converter and a single set of three-phase cores within an umbilical cable. The subsea distribution system, which may include a subsea transformer distributes the power to the electrical motors. Current sensor and measuring electronics are used to measure current on one or more of the phases used to drive each motor. Measurement data is transmitted to the surface where an analysis system is used to detect possible load imbalance conditions between the motors.

28 Claims, 5 Drawing Sheets

(56) References Cited

U.S. PATENT DOCUMENTS

| | | | |
|---|---|---|---|
| 5,515,230 A | 5/1996 | Ashley | |
| 5,659,219 A | 8/1997 | Momose et al. | |
| 5,699,219 A | 12/1997 | Arita et al. | |
| 5,764,129 A | 6/1998 | Syouji et al. | |
| 6,014,894 A | 1/2000 | Herron | |
| 6,188,552 B1 | 2/2001 | Jaeschke et al. | |
| 6,580,783 B1 | 6/2003 | Swale | |
| 6,595,487 B2 | 7/2003 | Johansen et al. | |
| 6,626,470 B1 | 9/2003 | Appleford et al. | |
| 6,867,364 B2 | 3/2005 | Hafskjold et al. | |
| 7,202,619 B1 | 4/2007 | Fisher | |
| 7,301,739 B2 | 11/2007 | Hamer | |
| 7,516,795 B2 | 4/2009 | Lopes Euphemio et al. | |
| 7,598,751 B2 | 10/2009 | Collins, Jr. et al. | |
| 7,847,189 B2 | 12/2010 | Findeisen | |
| 8,108,162 B2 | 1/2012 | Matsumoto | |
| 8,362,789 B2 | 1/2013 | Collins, Jr. et al. | |
| 8,439,080 B2 | 5/2013 | Uusipaikka | |
| 8,456,116 B2 | 6/2013 | Burdick | |
| 8,549,924 B2 | 10/2013 | Virtanen et al. | |
| 9,056,663 B2 | 6/2015 | Bø | |
| 9,308,618 B2 | 4/2016 | Benvegnu | |
| 2002/0175522 A1 | 11/2002 | Wacknov et al. | |
| 2004/0065873 A1 | 4/2004 | Peterson | |
| 2004/0135528 A1 | 7/2004 | Yasohara et al. | |
| 2008/0144442 A1 | 6/2008 | Combee et al. | |
| 2009/0056936 A1 | 3/2009 | McCoy, Jr. | |
| 2009/0234600 A1 | 9/2009 | Matsumoto | |
| 2010/0026317 A1 | 2/2010 | Collins, Jr. et al. | |
| 2010/0089126 A1 | 4/2010 | Sweeney | |
| 2010/0288501 A1 | 11/2010 | Fielder et al. | |
| 2011/0000677 A1 | 1/2011 | Overfield | |
| 2011/0089767 A1 | 4/2011 | Rocke et al. | |
| 2011/0093216 A1 | 4/2011 | Andersson et al. | |
| 2011/0140820 A1 | 6/2011 | Guentert, III et al. | |
| 2011/0188392 A1 | 8/2011 | Misumi et al. | |
| 2011/0251728 A1 | 10/2011 | Batho et al. | |
| 2011/0304289 A1 | 12/2011 | Burdick | |
| 2011/0316659 A1 | 12/2011 | Puchianu et al. | |
| 2012/0001482 A1 | 1/2012 | Burdick | |
| 2013/0033103 A1* | 2/2013 | McJunkin | H02J 3/22 307/11 |
| 2013/0063842 A1 | 3/2013 | Kataoka | |
| 2013/0220625 A1 | 8/2013 | Billington et al. | |
| 2014/0035504 A1 | 2/2014 | Rongve et al. | |
| 2014/0035759 A1 | 2/2014 | Ramsfjell et al. | |
| 2014/0097678 A1 | 4/2014 | Thibaut et al. | |
| 2014/0147243 A1 | 5/2014 | Torkildsen et al. | |
| 2014/0209289 A1 | 7/2014 | Boot et al. | |
| 2014/0217947 A1 | 8/2014 | Haugan | |
| 2014/0347897 A1* | 11/2014 | Broussard | H02J 3/36 363/35 |
| 2015/0016812 A1* | 1/2015 | Radan | E21B 36/04 392/478 |
| 2015/0070802 A1* | 3/2015 | Dong | H02H 3/16 361/49 |
| 2015/0188297 A1 | 7/2015 | Boe et al. | |
| 2015/0346266 A1 | 12/2015 | Dimino et al. | |
| 2016/0181964 A1 | 6/2016 | Nojima | |
| 2017/0082764 A1 | 3/2017 | Lasante et al. | |

FOREIGN PATENT DOCUMENTS

| | | |
|---|---|---|
| EP | 2610881 A1 | 7/2013 |
| GB | 2028003 A | 2/1980 |
| WO | 2005111484 A2 | 11/2005 |
| WO | 2008055515 A1 | 5/2008 |

OTHER PUBLICATIONS

International Preliminary Report on Patentability for International application No. PCT/EP2016/052418 dated Aug. 29, 2017.

International Search Report for International application No. PCT/EP2016/052424 dated Apr. 14, 2016.

International Preliminary Report on Patentability for International application No. PCT/EP2016/052424 dated Aug. 29, 2017.

International Search Report for International application No. PCT/EP2016/052422 dated Jul. 13, 2016.

International Preliminary Report on Patentability for International application No. PCT/EP2016/052422 dated Aug. 29, 2017.

* cited by examiner

MONITORING MULTIPLE SUBSEA ELECTRIC MOTORS

TECHNICAL FIELD

The present disclosure relates to subsea electric motors. More particularly, the present disclosure relates to monitoring multiple subsea electric motors.

BACKGROUND

The use of multiple motors connected to a single inverter drive is known in topside applications. Unlike with a single motor connected to a variable frequency drive (VFD), with multiple motors driven by the same VFD each motor may have its own overload and short circuit protection. When controlling a single motor, a VFD with adequate features can both provide short circuit and overload protection and will be able to sense an over current situation and take proper action to protect the motor.

With multiple smaller motors, connected to a single inverter drive output, the motor protection may be provided by individual relays. Larger motors might be powered by individual inverters, sometimes connected to a common rectifier and DC bus. However, none of these solutions are considered as practical in subsea applications.

Multiple subsea motors, operating from a topside single variable speed drive, have in the past been supplied via individual three phase cores in the umbilical cable system. In such cases the individual motor protection has been located topside, downstream from the inverter. However, this solution increases the number of cores in the umbilical system that in many cases is highly costly. Furthermore, if the transmission distance is long, both topside and subsea transformers may be highly beneficial or necessary. In such cases using separate three-phase umbilical cores, each subsea motor would need a separate transformer in order to be able to differentiate the pump motor currents and loading.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

According to some embodiments, a system is described for monitoring and protecting multiple subsea electric motors powered by a single three-phase power source. In the following, for simplicity, a system including only two motors is described. The invention, however, is able to monitor and protect any number of motors. The system includes: first and second subsea electrical motors deployed in a subsea location; a variable speed drive deployed at a surface facility and configured to provide power for and to control speed of the first and second subsea electrical motors; an umbilical cable including conductors electrically connected for transmitting three phase electrical power from the variable speed drive to the subsea location; a subsea power distribution system located at the subsea location configured to provide three phase electrical power transmitted through the umbilical cable to the first and second electric motors such that the variable speed drive controls speed of the first and second motors; a subsea monitoring system connected and configured to measure (e.g. current) at least one phase of the first motor and at least one phase of the second motor; and a communication system configured to transmit data based on measurements of the monitoring system to the surface facility.

According to some embodiments, the subsea power distribution system is a subsea transformer. According to some embodiments, current in all three phases of the first and second motors is measured. Temperature of the transformer oil within the subsea transformer and/or current for detection of a ground fault within the subsea transformer can also be measured.

According to some embodiments, the surface facility can detect a load imbalance between the first and second motors based at least in part on the transmitted data. A portion of the subsea monitoring system and the communication system can be configured to be retrievable using a remotely operated underwater vehicle (ROV).

According to some embodiments, the first and second motors are used to drive contra-rotating impeller assemblies of a subsea wet-gas compressor, or uni-rotating impellers on a common shaft with two motors coupled to the shaft, one in each end. According to some other embodiments, the first and second motors are used to drive first and second subsea fluid pumps that are connected in series or in parallel to a fluid flow line.

According to some embodiments, a system is described for protecting multiple subsea electric motors powered by a single three-phase power source. The system includes: a subsea monitoring system connected and configured to measure current of at least one phase of a first subsea electrical motor and at least one phase of a second subsea electrical motor. The first and second motors are driven by three phase electrical power transmitted through a single set of three-phase cores in an umbilical cable. The system also includes: a communication system configured to transmit data based on measurements of the monitoring system to the surface facility; and a data analysis system at the surface facility configured to analyze the transmitted data, and detect therefrom a load imbalance condition between the first and second motors.

According to some embodiments, a method is described for monitoring and protecting multiple subsea electric motors powered by a single three-phase power source. The method includes: transmitting three-phase electrical power through a single set of three-phase cores in an umbilical cable from a surface facility to a subsea location; distributing the three-phase electrical power to a first and second subsea electrical motors; measuring current using current sensors in at least one phase of electrical power used to drive each of the first and second electrical motors; transmitting data representing measurements made by the current sensors from the subsea location to the surface facility; and detecting a potential load imbalance between the first and second motors based at least in part on the transmitted data.

According to some embodiments, one or more of the described systems and/or methods can be used in topside or subsea fluid processing equipment in an analogous fashion.

BRIEF DESCRIPTION OF THE DRAWINGS

The subject disclosure is further described in the detailed description which follows, in reference to the noted plurality of drawings by way of non-limiting examples of embodiments of the subject disclosure, in which like reference numerals represent similar parts throughout the several views of the drawings, and wherein.

DETAILED DESCRIPTION

The particulars shown herein are by way of example, and for purposes of illustrative discussion of the embodiments of the subject disclosure only and are presented in the cause of providing what is believed to be the most useful and readily understood description of the principles and conceptual aspects of the subject disclosure. In this regard, no attempt is made to show structural details of the subject disclosure in more detail than is necessary for the fundamental understanding of the subject disclosure, the description taken with the drawings making apparent to those skilled in the art how the several forms of the subject disclosure may be embodied in practice. Further, like reference numbers and designations in the various drawings indicate like elements.

According to some embodiments, monitoring and protection is provided for subsea load feeders originating from a common subsea transformer and/or power transmission umbilical. When several loads, such as electric motors driving pumps or compressors are fed from a common source at fixed or variable frequency, the individual circuits for each load should be monitored and protected. Techniques are described herein for providing such monitoring and protection in order to operate the loads in a safe and controlled way.

Figure 1:
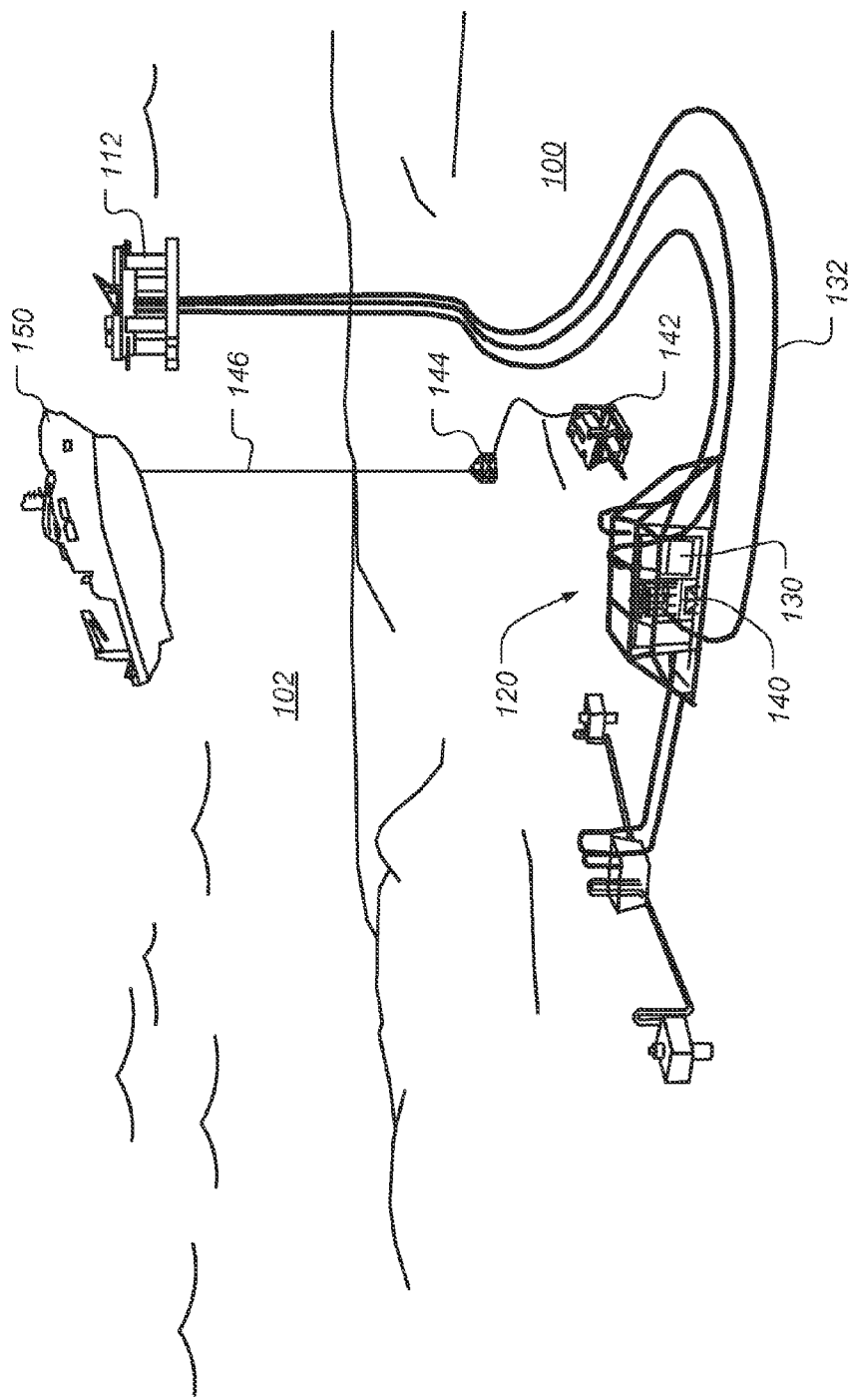
FIG. 1 is a diagram illustrating a subsea environment in which a monitoring system for multiple subsea electric motors is deployed, according to some embodiments.

FIG. 1 is a diagram illustrating a subsea environment in which a monitoring system for multiple subsea electric motors is deployed, according to some embodiments. On sea floor 100 a station 120 is shown which is downstream of several wellheads being used, for example, to produce hydrocarbon-bearing fluid from a subterranean rock formation. Station 120 includes a subsea wet gas compressor 130, which has contra-rotating impellers driven by two electric motors. According to some other embodiments, the station 120 can include other compressors and/or pumps driven by electric motors, such as multi-pump subsea pumping module 350 shown in FIG. 3, infra. The station 120 is connected to one or more umbilical cables, such as umbilical 132. The umbilicals in this case are being run from a platform 112 through seawater 102, along sea floor 100 and to station 120. In other cases, the umbilicals may be run from some other surface facility such as a floating production, storage and offloading unit (FPSO), or a shore-based facility. In many cases to reduce energy losses, it is desirable to transmit energy through the umbilicals at higher voltages than is used by the electric motors in compressor 130. Station 120 thus also includes a step-down transformer 140, which converts the higher-voltage three-phase power being transmitted over the umbilical 132 to lower-voltage three-phase power for use by compressor 130. As will be described in further detail infra, umbilical 132 also has one or more data lines for transmission of monitoring data back up to platform 112. The umbilical 132 can also be used to supply barrier and other fluids, along with control and other data lines for use with the subsea equipment in station 120. Also visible in FIG. 1 is surface vessel 150 deploying a remotely operated underwater vehicle (ROV) 142, tethered using main lift umbilical 146 and tether management system 144.

Figure 2:
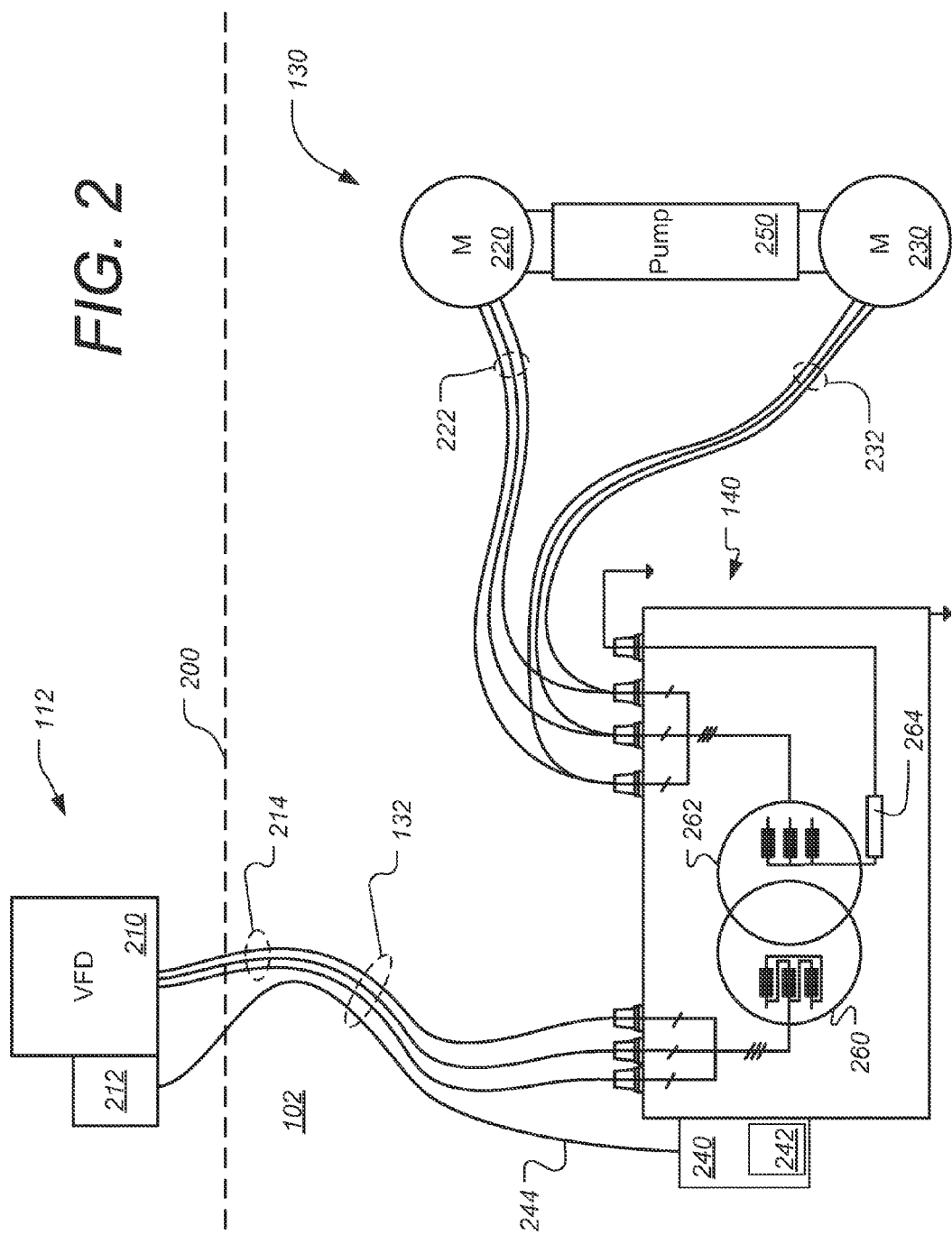
FIG. 2 is a schematic diagram illustrating certain aspects of a monitoring system for multiple subsea electric motors, according to some embodiments.

FIG. 2 is a schematic diagram illustrating certain aspects of a monitoring system for multiple subsea electric motors, according to some embodiments. A variable frequency drive (VFD) 210 and data analysis system 212 are located on the surface in platform 112 (or other surface facility). According to some embodiments, a step-up transformer (not shown) is also located on the surface on platform 112. Three-phase power from VFD 210 is transmitted through three-phase conductors 214 within umbilical 132 to the subsea step-down transformer 140. Transformer 140 feeds power directly to the upper motor 220 and the lower motor 230 of compressor module 130 via sets of power cables 222 and 232 respectively. In this example, compressor module 130 includes a wet gas compressor 250 that uses contra-rotating elements driven by upper and lower motors 220 and 230. For further details on contra rotating compressors, see co-pending U.S. Patent Application Publ. No. 2014/0147243, which is incorporated herein by reference. Electronics canister 240, which includes digital electronics board 242 is configured to convert the raw signals from current transducers into a digital format (e.g. CANBus or other format). According to some embodiments, canister 240 is atmospheric, has two ROV connectors and is configured to individually ROV retrievable, for example using ROV 142 shown in FIG. 1. Data from measurements on the motor drive circuits is transmitted from canister 240 through data line 244 to surface data analysis system 212 through umbilical 132. According to some embodiments, the data line 244 interfaces with a subsea control module on subsea station 120 (shown in FIG. 1), which formats and transmits the data to system 212 via umbilical 132. Measurements of current for one or more of the phases for each of the upper and lower compressor motors 220 and 230 allows for monitoring of the load split between the motors by surface data analysis system 212. Also shown in FIG. 2 are some of the components of transformer 140 including primary windings 260, secondary winding 262 and high-resistance grounding unit 264.

Figure 3:
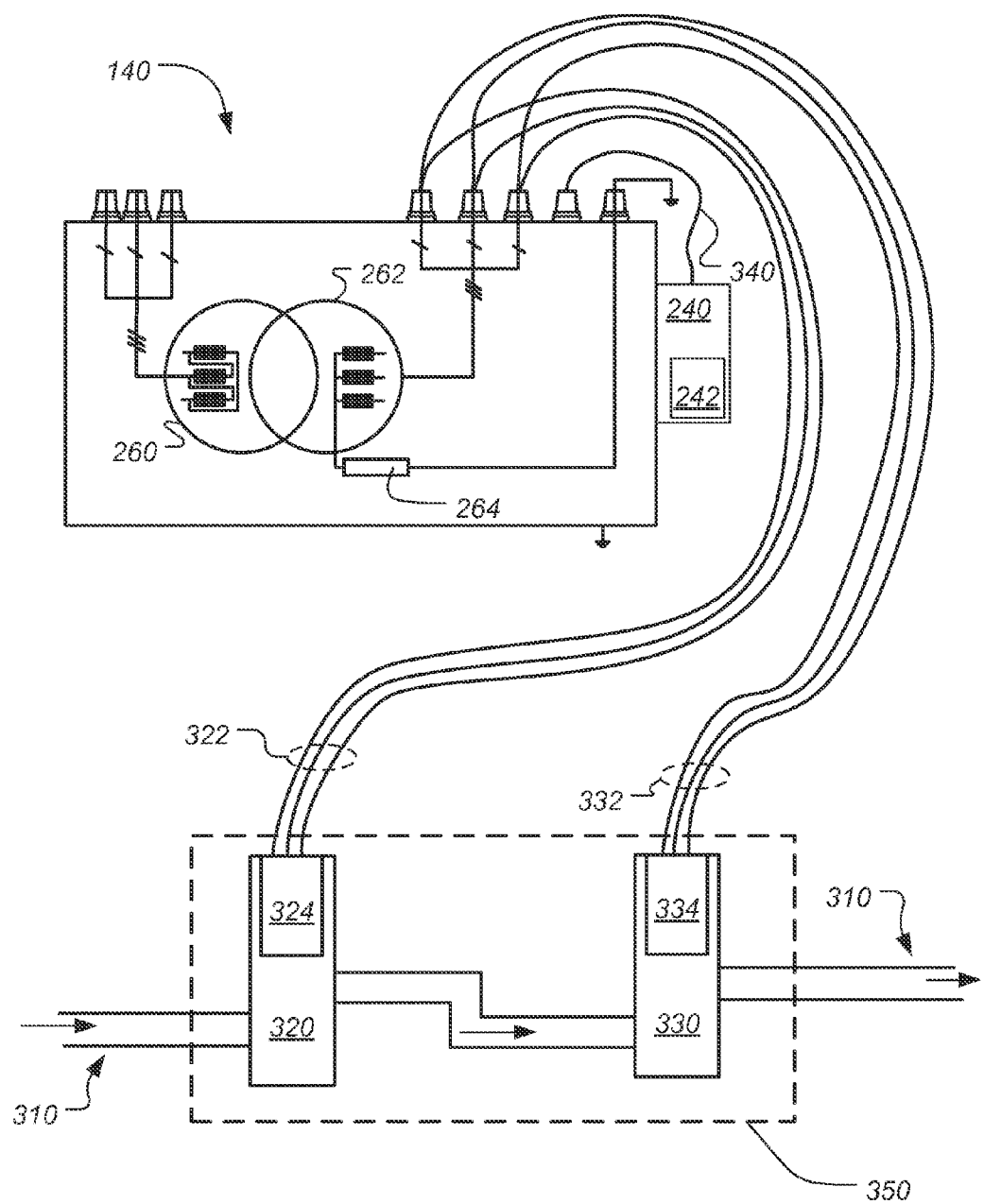
FIG. 3 is a schematic diagram illustrating certain aspects of a monitoring system for multiple subsea electric motors, according to some other embodiments.

FIG. 3 is a schematic diagram illustrating certain aspects of a monitoring system for multiple subsea electric motors, according to some other embodiments. In this example, instead of a wet gas compressor, subsea transformer 140 is used to drive two electric motors 324 and 334 being used to operate fluid pumps 320 and 330 connected in series to pump fluid in flowline 310. The two pumps 320 and 330 together form a subsea pumping module 350. Sets of three-phase power cables 322 and 332 are used to transmit power to motors 324 and 334, respectively. According to some embodiments, subsea transformer 140 is a fault tolerant subsea transformer having dual barrier systems and being arranged with an upper junction and instrument tank and a lower transformer tank. For further details on such transformers, see co-pending U.S. patent application Ser. No. 14/631,649, filed on Feb. 25, 2015, entitled "Fault Tolerant Subsea Transformer", which is herein incorporated by reference in its entirety. As described in further detail, infra, current measurements are made on the phases for each of the sets of wires 322 and 332 within an upper instrument tank of transformer 140, and wires 340 carrying measurement signals run from the instrument tank to electronics canister 240.

The load for each individual motor (220 and 230 in FIG. 2, and 324 and 334 in FIG. 3) cannot be predicted by the topside frequency converter (VFD 210 in FIG. 2), without subsea measurement. For example, the shaft loading of each motor may be different due to uneven pump shaft loading. According to some embodiments, the measurement of the motor drive currents, (which can be on one, two or all three phases) are used as a measure of the individual loading of each motor. By measuring at least one of the phase currents in each motor, the relative and absolute loading of two or more motors can be determined (e.g. on the surface by data analysis system 212). According to some embodiments, the subsea current measurement and monitoring system has electronics and transmission capacity to relay the information (e.g. via data line 244) to a topside location (e.g. data analysis system 212 on platform 112) in a real-time or near-real-time regime. According to some embodiments, data is sent up the data line 244 with a frequency of about once per second. Since in many cases the loadings of each motor cannot be adjusted locally subsea, the information is processed topside by a computational device within data analysis system 212, which in turn processes the data and provides necessary advice to the control system and operator to take appropriate actions to prevent overloading an individual motor.

Figure 4:
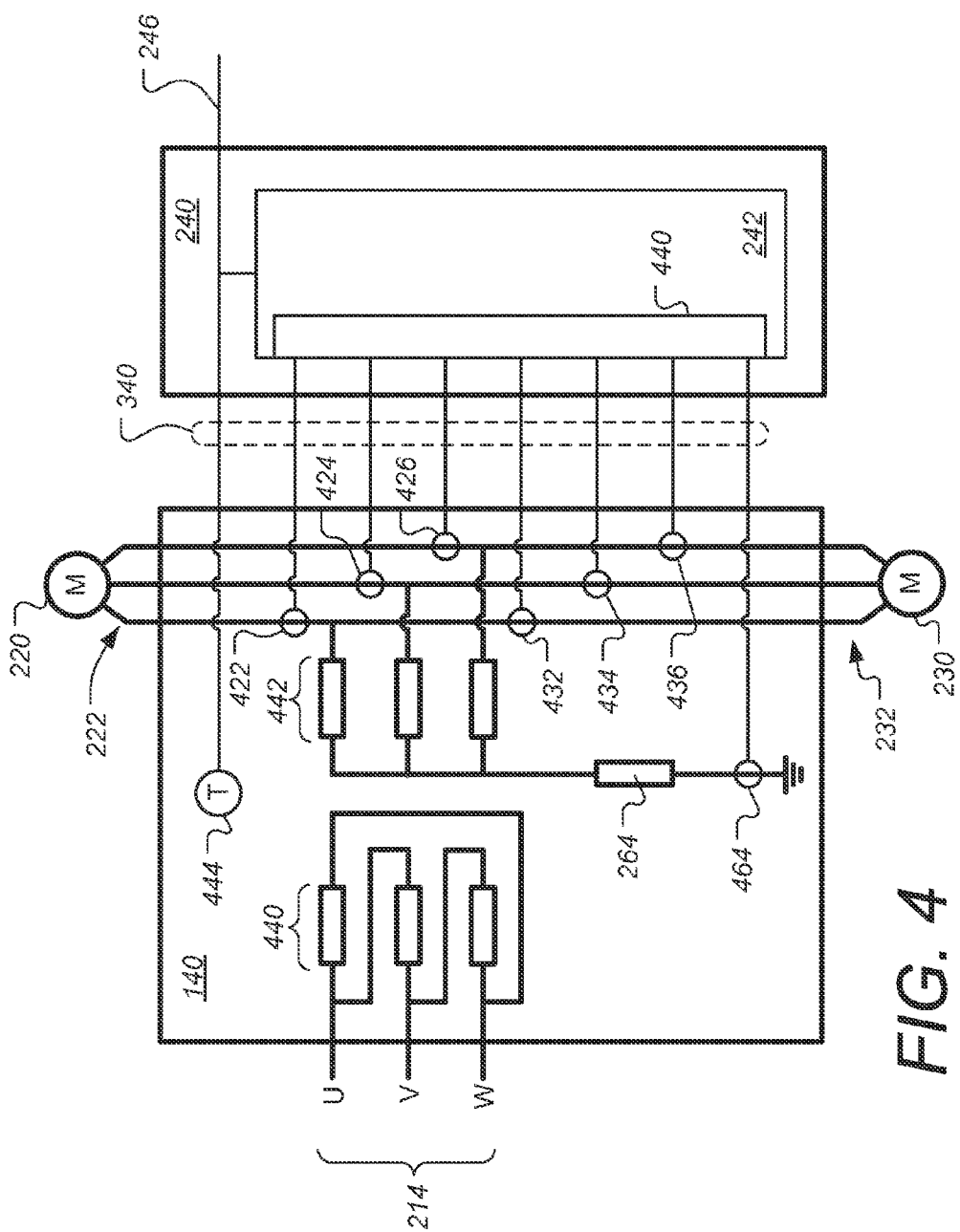
FIG. 4 is a schematic diagram showing further details of certain aspects of a monitoring system for multiple subsea electric motors, according to some embodiments.

FIG. 4 is a schematic diagram showing further details of certain aspects of a monitoring system for multiple subsea electric motors, according to some embodiments. In this example, the system is used with both subsea transformer 140 and a high resistance grounding (HRG) unit 264. According to some embodiments, the HRG unit 264 is a seawater-based HRG device or an integrated HRG device. For further details of seawater-based HRG devices, see co-pending U.S. patent application Ser. No. 14/631,661, filed on Feb. 25, 2015, entitled "Subsea Transformer With Seawater High Resistance Ground", which is herein incorporated by reference in its entirety. For further details of integrated HRG devices, see co-pending U.S. patent application Ser. No. 14/631,676, filed on Feb. 25, 2015, entitled "Subsea Transformer With Integrated High Resistance Ground", which is herein incorporated by reference in its entirety. High voltage power from three-phase conductors 214 within the umbilical is supplied to the subsea compressors from dedicated subsea transformer 140. The primary windings 440 are arranged in a "delta" configuration and the secondary windings 442 are arranged in a "wye" configuration. The secondary side of the subsea transformer 140 is split to supply the two motors 220 and 230 of the wet gas compressor in parallel. According to some embodiments, the following parameters are monitored: (1) motor load balance; (2) phase currents upper motor ($U_U$, $V_U$, $W_U$ using current sensors 422, 424 and 426 respectively); phase currents lower motor ($U_L$, $V_L$, $W_L$ using current sensors 432, 434 and 436 respectively). According to some embodiments, current sensor 464 is used to sense current flowing through HRG unit 264 so that the data analysis system 212 can also detect ground fault conditions. According to some embodiments, the current sensors 422, 424, 426, 432, 434, 436 and 464 are current transducers that output current signals on wires 340 into electronics canister 240. In electronics canister 240 hall-effect transducers 440 are used to convert the current transducer signals into input signals for digital circuitry 242 in electronics canister 240. According to some embodiments, temperature sensor 444 is also used to sense temperature of the transformer oil (for example near the top of transformer tank 360 shown in FIG. 3).

The current supplied to the two motors 220 and 230 is continuously monitored to detect uneven load split. All three phases of the two motors 220 and 230 are measured utilizing current transformers 422, 424, 426, 432, 434 and 436. The current signals are transmitted over wires 340 to the retrievable electronics canister 240 where the signals are interfaced to the signal converter in digital circuitry 242. Hall-effect transducers 440 convert the phase current signals to digital format. Rms values are then calculated based on the distorted current sine wave signal. The rms values are then transmitted to the subsea control module (e.g. in station 120 shown in FIG. 1) via a bus connection 246 and on to the surface via umbilical 132 (also shown in FIG. 1).

Figure 5:
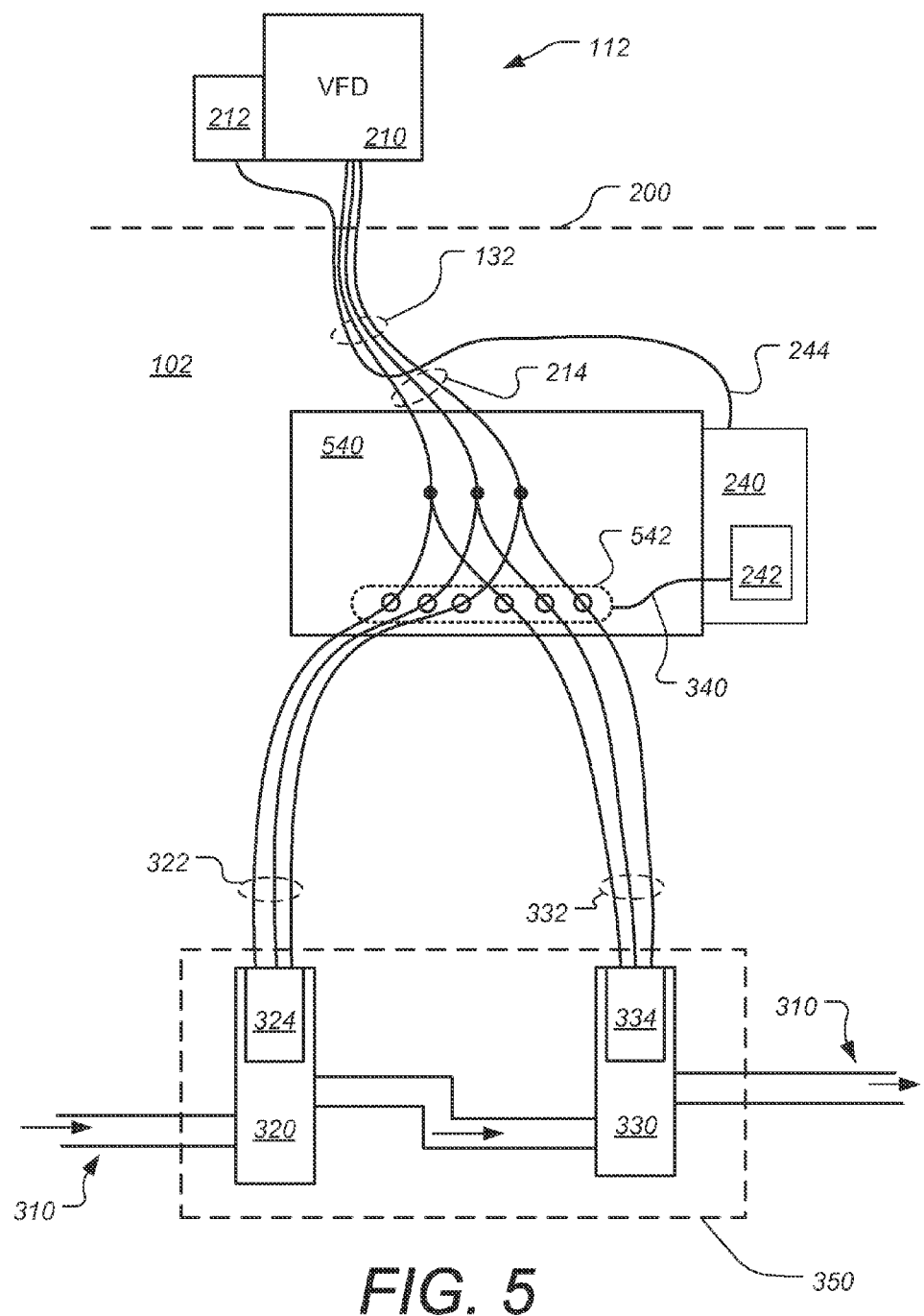
FIG. 5 is a schematic diagram illustrating certain aspects of a monitoring system for multiple subsea electric motors, according to some other embodiments.

FIG. 5 is a schematic diagram illustrating certain aspects of a monitoring system for multiple subsea electric motors, according to some other embodiments. In this example, a subsea transformer is not used in powering subsea motors 324 and 334. Power through umbilical 132 is transmitted through a single set of three-phase cores 214 to a subsea distribution system 540. The power is fed directly to both motors 324 and 334 via sets of three phase power cables 322 and 332, respectively. The current for each phase for each motor is measured by current sensors 542. Current signals are sent to electronics canister 240 via set of wires 340. The data signals from electronics canister 240 are sent via data line 244 to surface data analysis system 212 through umbilical 132. In the case shown in FIG. 5, two motors 324 and 334 are used to drive two pumps 320 and 330 connected in series in a pumping module 350, such as shown in FIG. 3. However, according to some other embodiments, the electrical power is used to drive upper and lower motors of a wet gas compressor, such as shown in FIG. 2.

While the subject disclosure is described through the above embodiments, it will be understood by those of ordinary skill in the art that modification to and variation of the illustrated embodiments may be made without departing from the inventive concepts herein disclosed. Moreover, while some embodiments are described in connection with various illustrative structures, one skilled in the art will recognize that the system may be embodied using a variety of specific structures. Accordingly, the subject disclosure should not be viewed as limited except by the scope and spirit of the appended claims.

What is claimed is:

1. A system for monitoring and protecting multiple subsea electric motors powered by a single power source, the system comprising:
   first and second subsea electrical motors deployed in a subsea location;
   an umbilical cable including conductors electrically connected and configured for transmitting three phase electrical power from said single three-phase power source to the subsea location;
   a subsea power distribution system located at the subsea location configured to provide the three phase electrical power transmitted through the umbilical cable to the first and second electric motors;
   a subsea monitoring system connected and configured to measure a first parameter of at least one phase of the first motor and a second parameter of at least one phase of the second motor;
   a communication system configured to transmit data based at least in part on the first parameter of the at least one phase of the first motor and the second parameter of the at least one phase of the second motor to a surface facility; and a data analysis system at the surface facility configured to determine a first load of the first motor based at least in part on the first parameter of the at least one phase of the first motor and determine a second load of the second motor based at least in part on the second parameter of the at least one phase of the second motor.

2. The system according to claim 1 further comprising a variable speed drive deployed at the surface facility and configured to provide power for and to control speed of the first and second subsea electrical motors, wherein the subsea power distribution system provides the three-phase electrical power transmitted through the umbilical cable to the first and second electric motors such that the variable speed drive controls speed of the first and second motors.

3. The system according to claim 2 wherein the subsea power distribution system is a subsea transformer.

4. The system according to claim 2 wherein the first parameter comprises a current of the at least one phase of the first motor and the second parameter comprises a current of the at least one phase of the second motor.

5. The system according to claim 4 wherein the subsea monitoring system is further connected and configured to measure the current of all three phases of the first motor and the current of all three phases of the second motor.

6. The system according to claim 4 wherein the subsea monitoring system comprises current transducers configured to measure the current of the at least one phase of the first motor and the at least one phase of the second motor.

7. The system according to claim 6 wherein the subsea monitoring system comprises hall-effect transducers configured to convert signals from the current transducers into input signals for digital circuitry residing in the subsea monitoring system.

8. The system according to claim 3 wherein the subsea monitoring system is further connected and configured to measure a temperature of a transformer oil within the subsea transformer.

9. The system according to claim 3 wherein the subsea monitoring system is further connected and configured to detect an occurrence of a ground fault within the subsea transformer.

10. The system according to claim 3 wherein the data analysis system is configured to detect a load imbalance between the first and second motors based at least in part on the first parameter of the at least one phase of the first motor and the second parameter of the at least one phase of the second motor.

11. The system according to claim 1 wherein at least a portion of the subsea monitoring system and the communication system are configured to be retrievable using a remotely operated underwater vehicle (ROV).

12. The system according to claim 1 wherein the first and second subsea electrical motors are configured to drive impeller assemblies of a subsea compressor.

13. The system according to claim 1 wherein the first and second subsea electrical motors are configured to drive impellers on a common shaft, wherein the first motor is coupled to a first end of the shaft, and the second motor is coupled to a second end of the shaft.

14. The system according to claim 1 wherein the first and second subsea electrical motors are configured to drive first and second subsea fluid pumps that are connected to a fluid flow line.

15. The system according to claim 1 further comprising a third subsea electrical motor deployed in the subsea location wherein the subsea power distribution system is further configured to provide the three-phase electrical power to the third subsea electrical motor, and the subsea monitoring system is further connected and configured to measure a third parameter of at least one phase of the third subsea electrical motor.

16. A system for protecting multiple subsea electric motors powered by a single three-phase power source, the system comprising:
a subsea monitoring system connected and configured to measure current of at least one phase of a first subsea electrical motor and at least one phase of a second subsea electrical motor, the first and second motors being driven by three phase electrical power transmitted through a single set of three-phase cores in an umbilical cable;
a communication system configured to transmit data based on measurements of said monitoring system to a said surface facility; and
a data analysis system at said surface facility configured to analyze the transmitted data and detect therefrom a load imbalance condition between the first and second motors.

17. The system according to claim 16 wherein a variable speed drive is deployed at the surface facility and is configured to provide power for and control speed of the first and second subsea electrical motors.

18. The system according to claim 16 wherein a subsea step-down transformer is used to convert higher voltage electrical energy being transmitted through said single set of three-phase cores in the umbilical cable into lower voltage electrical energy to drive said first and second motors.

19. The system according to claim 18 wherein said monitoring system includes a plurality of current transformers positioned and configured to sense current in each of three phases for each of the first and second motors, said plurality of current transformers being positioned within said subsea transformer.

20. The system according to claim 18 wherein said subsea monitoring system is further connected and configured to measure temperature of a transformer oil within said subsea transformer.

21. The system according to claim 18 wherein said subsea monitoring system is further connected and configured to detect occurrence of a ground fault within or downstream the said subsea transformer.

22. The system according to claim 16 wherein at least a portion of said subsea monitoring system and said communication system are configured to be retrievable using a remotely operated underwater vehicle (ROV).

23. The system according to claim 16 wherein said first and second subsea electrical motors are configured to drive contra-rotating impeller assemblies of a subsea wet-gas compressor.

24. A method for monitoring and protecting multiple subsea electric motors powered by a single three-phase power source, the method comprising:
transmitting three-phase electrical power through a single set of three-phase cores in an umbilical cable from a surface facility to a subsea location;
distributing said three-phase electrical power to a first and second subsea electrical motors;
in the subsea location, measuring current using current sensors in at least one phase of electrical power used to drive each of the first and second electrical motors;

transmitting data representing measurements made by said current sensors from said subsea location to the surface facility; and detecting a potential load imbalance between said first and second motors based at least in part on the transmitted data.

25. The method according to claim 24 further comprising transforming a higher voltage electrical power transmitted through said single set of three-phase cores in the umbilical cable into a lower voltage electrical power for driving said first and second motors using a subsea step-down transformer.

26. The method according to claim 24 wherein said measuring includes measuring current of all three phases of the first motor and all three phases of the second motor.

27. The method according to claim 25 further comprising measuring temperature of a transformer oil within said subsea transformer.

28. The method according to claim 25 further comprising monitoring a high resistance ground unit in said subsea transformer to allow detection of a ground fault within or downstream the said subsea transformer.

* * * * *